(12) United States Patent
Yu et al.

(10) Patent No.: US 7,892,909 B2
(45) Date of Patent: Feb. 22, 2011

(54) POLYSILICON GATE FORMATION BY IN-SITU DOPING

(75) Inventors: Chen-Hua Yu, Hsin-Chu (TW); Ding-Yuan Chen, Taichung (TW); Chu-Yun Fu, Hsinchu (TW); Liang-Gi Yao, Hsinchu (TW); Chen-Nan Yeh, Hsi-Chih (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 378 days.

(21) Appl. No.: 11/729,009

(22) Filed: Mar. 28, 2007

(65) Prior Publication Data
US 2008/0194087 A1 Aug. 14, 2008

Related U.S. Application Data

(63) Continuation-in-part of application No. 11/705,655, filed on Feb. 12, 2007, now abandoned.

(51) Int. Cl.
*H01L 29/76* (2006.01)
(52) U.S. Cl. ............................. 438/201; 257/E21.154
(58) Field of Classification Search ......... 438/199–233, 438/542–565; 257/E21.154–155, 182, 195–201
See application file for complete search history.

(56) References Cited

U.S. PATENT DOCUMENTS

| 5,840,607 | A | 11/1998 | Yeh et al. |
|---|---|---|---|
| 6,033,950 | A | 3/2000 | Chen et al. |
| 6,171,939 | B1 | 1/2001 | Lin |
| 6,281,559 | B1 | 8/2001 | Yu et al. |
| 6,380,055 | B2 * | 4/2002 | Gardner et al. .............. 438/585 |
| 6,541,353 | B1 | 4/2003 | Sandhu et al. |
| 6,670,226 | B2 * | 12/2003 | Lin et al. ..................... 438/199 |
| 6,908,803 | B2 * | 6/2005 | Schuegraf et al. ........... 438/201 |
| 7,018,887 | B1 * | 3/2006 | Pan ............................. 438/225 |
| 7,132,322 | B1 * | 11/2006 | Greene et al. ............... 438/199 |
| 7,427,561 | B2 * | 9/2008 | Lee ............................. 438/627 |
| 7,510,943 | B2 * | 3/2009 | Li ............................... 438/301 |
| 2002/0004294 | A1 | 1/2002 | Gardner et al. |
| 2003/0170994 | A1 | 9/2003 | Lin et al. |

(Continued)

OTHER PUBLICATIONS

Taiwanese Patent Office, Office Action dated Oct. 1, 2010, Application No. 096115055, 6 pages.

(Continued)

*Primary Examiner*—Matthew W Such
*Assistant Examiner*—Ali Naraghi
(74) *Attorney, Agent, or Firm*—Haynes and Boone, LLP

(57) ABSTRACT

A method for forming a semiconductor structure includes providing a semiconductor substrate; forming a gate dielectric layer on the semiconductor substrate; forming a first silicon-containing layer on the gate dielectric layer, wherein the first silicon-containing layer is substantially free from p-type and n-type impurities; forming a second silicon-containing layer over the first silicon-containing layer, wherein the second silicon-containing layer comprises an impurity; and performing an annealing to diffuse the impurity in the second silicon-containing layer into the first silicon-containing layer.

20 Claims, 7 Drawing Sheets

U.S. PATENT DOCUMENTS

2004/0178437 A1    9/2004    Schuegraf et al.
2005/0059228 A1*   3/2005    Bu et al. .................... 438/595
2006/0180873 A1    8/2006    Pelella et al.

OTHER PUBLICATIONS

Chiba, Y., et al., "Epitaxial growth of P atomic layer doped Si film by alternate surface reactions of $PH_3$ and $Si_2H_6$ on strained $Si_{1-x}Ge_x$/Si(1 0 0) in ultraclean low-pressure CVD," Semiconductor Science and Technology, vol. 22 (2007), pp. S118-S122, Institute of Physics Publishing.

Ishihara, T., et al., "Modeling of screening effect on remote Coulomb scattering due to gate impurities by nonuniform free carriers in poly-Si gate," Journal of Applied Physics, vol. 102, No. 073702, (2007) pp. 1-18, American Institute of Physics.

Murota, J., et al., "Atomically Controlled Processing for Group IV Semiconductors by Chemical Vapor Deposition," Japanese Journal of Applied Physics, vol. 45, No. 9A (2006) pp. 6767-6785.

Sato, T., et al., "Dominant Factor for the Concentration of Phosphorus Introduced by Vapor Phase Doping (VPD)," Japanese Journal of Applied Physics, vol. 37, Mar. 1998, Part 1, No. 3B, pp. 1162-1165.

* cited by examiner

POLYSILICON GATE FORMATION BY IN-SITU DOPING

This continuation-in-part application claims the benefit of priority of U.S. application Ser. No. 11/705,655, filed Feb. 12, 2007 now abandoned, entitled "Polysilicon Gate Formation by In-Situ Doping," which application is hereby incorporated herein by reference.

TECHNICAL FIELD

This invention relates generally to semiconductor devices, and more particularly to the formation of metal-oxide-semiconductor devices having polysilicon gates.

BACKGROUND

Metal-oxide-semiconductor (MOS) devices are basic building elements in integrated circuits. In conventional MOS devices, gate electrodes often comprise polysilicon doped with p-type or n-type impurities, using doping operations such as ion implantation or thermal diffusion. FIG. 1 illustrates a conventional MOS device having an implanted gate electrode. In a typical formation process, after forming a gate stack including gate dielectric 4 and polysilicon gate electrode 6, implantations are performed to dope impurities. The implantations typically include an implantation to form lightly-doped source and drain regions and an implantation to form deep source and drain regions.

MOS devices with polysilicon gate electrodes exhibit a carrier depletion effect, also referred to as a poly depletion effect (also known as polysilicon depletion). The poly depletion effect occurs when an applied electric field sweeps away carriers from a region of gate electrode 6 close to gate dielectric 4, forming a depletion layer. In n-doped polysilicon, the depletion layer includes ionized non-mobile donor sites. Whereas in p-doped polysilicon, the depletion layer includes ionized non-mobile acceptor sites. The depletion effect increases the effective gate dielectric thickness, making it more difficult for an inversion layer to be created at the surface of the semiconductor.

Typically, implanted impurities have a high doping concentration in an upper portion of gate electrode 6, while in region 8 of gate electrode 6, which is a lower portion close to gate dielectric 4, the impurity concentration is low. The low impurity concentration at the interface region of gate electrode 6 and gate dielectric 4 increases the likelihood of poly depletion.

FIG. 2 illustrates an intermediate stage of a method for solving the poly depletion problem. After a gate dielectric layer 12 is formed on substrate 10, polysilicon layer 14 is formed on gate dielectric layer 12. Polysilicon layer 14 is in-situ doped during its formation with a p-type or an n-type impurity. Assuming a p-type impurity is in-situ doped, a portion of polysilicon layer 14 in NMOS region 16 is removed, exposing underlying gate dielectric layer 12, while a portion of polysilicon layer 14 in PMOS region 18 is left un-removed. In subsequent steps, as shown in FIG. 3, polysilicon layer 20, which is in-situ doped with an n-type impurity, is formed in NMOS region 16. In subsequent steps, polysilicon layers 14 and 20 are then patterned to formed gate stacks. By in-situ doping impurities, the interface regions will have high impurity concentrations, and the polysilicon depletion problem is solved.

The removal of polysilicon layer 14 from NMOS region 16, however, will cause a top portion of the underlying gate dielectric layer 12 to be removed, thus resulting in variations in the thickness of the gate dielectric layer 12. Variations in the thickness of gate dielectrics in the resulting MOS devices undesirably affect the performance of the MOS devices. In advanced technologies, wherein the thickness of gate dielectric layer 12 is reduced to about 15 Å or below, the variations in the thickness of gate dielectrics is significant. A solution is thus needed to eliminate, or at least reduce, the thickness variations.

SUMMARY OF THE INVENTION

In accordance with one aspect of the present invention, a method for forming a semiconductor structure includes providing a semiconductor substrate; forming a gate dielectric layer on the semiconductor substrate; forming a first silicon-containing layer on the gate dielectric layer, wherein the first silicon-containing layer is substantially free from p-type and n-type impurities; forming a second silicon-containing layer over the first silicon-containing layer, wherein the second silicon-containing layer comprises an impurity; patterning the gate dielectric layer and the first and the second silicon-containing layers to form a gate stack; and performing an annealing to diffuse the impurity in the second silicon-containing layer into the first silicon-containing layer.

In accordance with another aspect of the present invention, a method for forming a semiconductor structure includes providing a semiconductor substrate; forming a gate dielectric layer on the semiconductor substrate; forming a first silicon-containing layer on the gate dielectric layer, wherein the first silicon-containing layer is substantially free from p-type and n-type impurities; forming a second silicon-containing layer in a first region and over the first silicon-containing layer, wherein the second silicon-containing layer comprises a first impurity of a first conductivity type, and wherein a second region is free from the second silicon-containing layer; forming a third silicon-containing layer in the second region and over the first silicon-containing layer, wherein the third silicon-containing layer comprises a second impurity of a second conductivity type opposite the first conductivity type, and wherein the first region is free from the third silicon-containing layer; and performing a diffusion annealing to diffuse the first and the second impurities in the second and the third silicon containing layers into the respective portions of the underlying first silicon-containing layer.

In accordance with yet another aspect of the present invention, a method for forming a semiconductor structure includes providing a semiconductor substrate comprising a first region and a second region; forming a gate dielectric layer on the semiconductor substrate; forming a first silicon-containing layer on the gate dielectric layer, wherein the first silicon-containing layer is substantially free from p-type and n-type impurities; forming a second silicon-containing layer over the first silicon-containing layer, wherein the second silicon-containing layer is in-situ doped with a first impurity of a first conductivity type; removing the second silicon-containing layer from the second region; forming a third silicon-containing layer, wherein the third silicon-containing layer in the first region is over the first silicon-containing layer, and wherein the third silicon-containing layer is in-situ doped with a second impurity of a second conductivity type opposite the first conductivity type; removing the third silicon-containing layer from the first region; patterning the first and the second silicon-containing layers in the first region to form a first gate stack in the first region; patterning the first and the third silicon-containing layers in the second region to form a second gate stack in the second region; and performing an annealing to diffuse the first impurity into a portion of the first silicon-containing layer directly under a remaining portion of the second silicon-containing layer, and to diffuse the second impurity into a portion of the first silicon-containing layer directly under a remaining portion of the third silicon-containing layer.

The advantageous feature of the present invention includes reduced variation in the thickness of gate dielectrics, so that the resulting MOS devices are more reliable.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for reducing polysilicon depletion (or poly-depletion) effect of polysilicon gates is provided. The intermediate stages of manufacturing embodiments of the present invention are illustrated. Throughout various views and illustrative embodiments of the present invention, like reference numbers are used to designate like elements.

Figure 1:
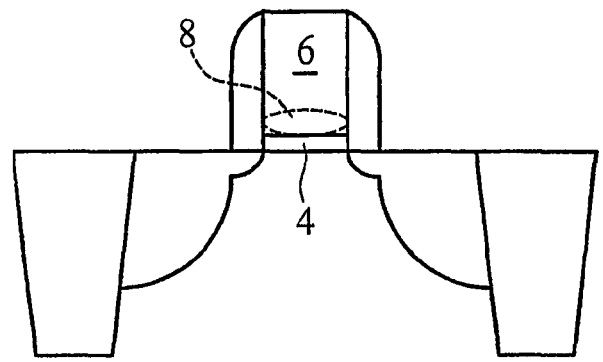
FIG. 1 illustrates a conventional MOS device, wherein impurities are introduced into a gate electrode by implantation.
Figure 2:
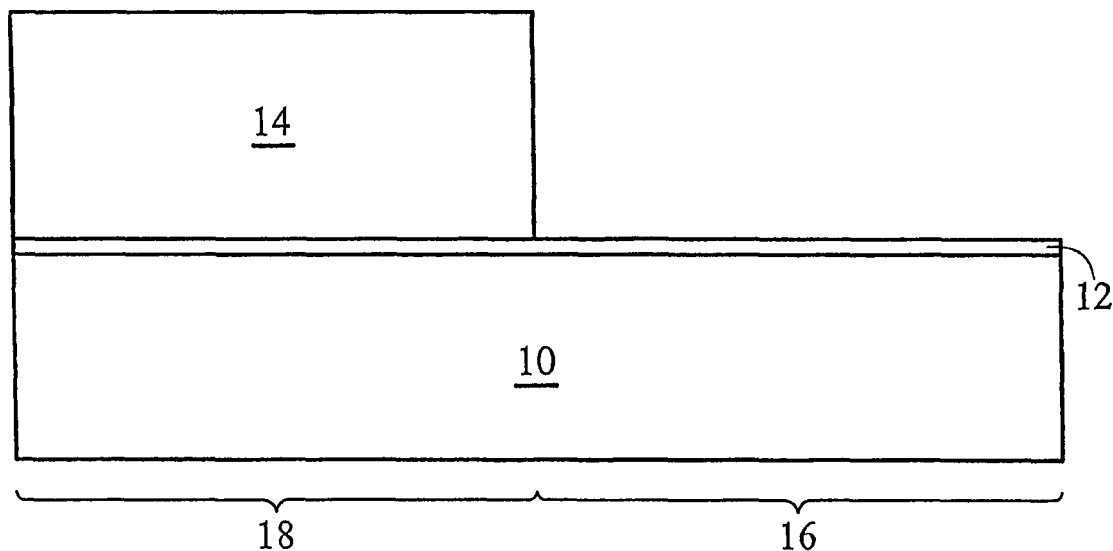
FIGS. 2 through 3 are cross-sectional views of intermediate stages in the manufacturing of conventional PMOS and NMOS devices, wherein gate electrodes are in-situ doped.
Figure 3:
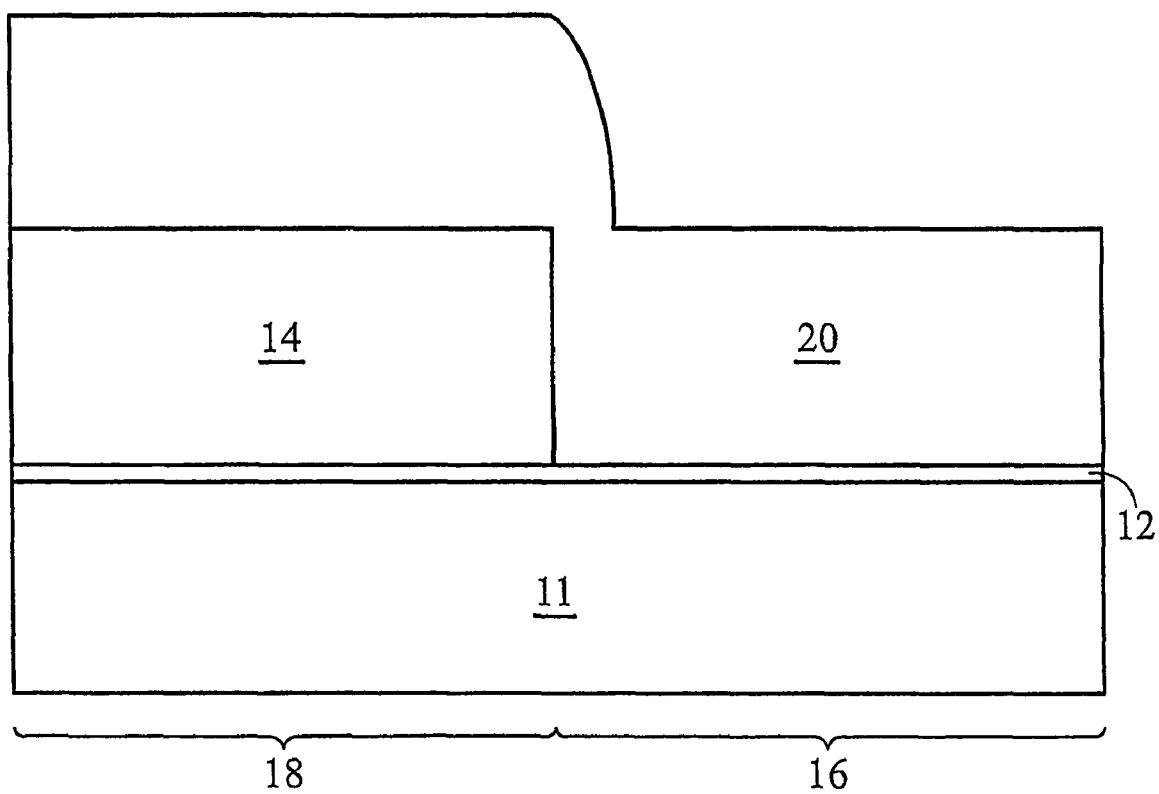
Figure 4A:
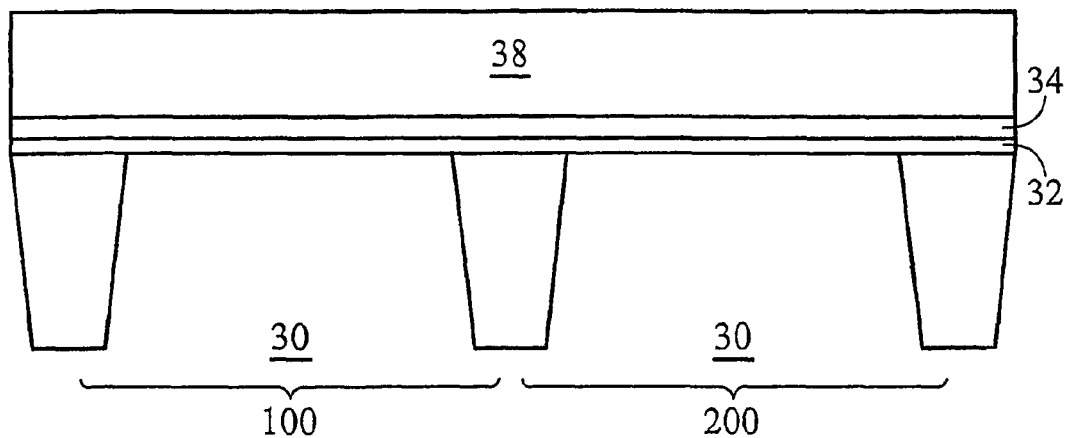
FIGS. 4A through 12 are cross-sectional views of intermediate stages in the manufacturing of embodiments of the present invention.

FIG. 4A illustrates the formation of gate dielectric layer 32, silicon-containing layer 34 and silicon-containing layer 38 on substrate 30. Substrate 30 includes an active region 100 for forming a PMOS device and an active region 200 for forming an NMOS device. Substrate 30 preferably comprises bulk silicon, although other commonly used structures and semiconductor materials such as silicon-on-insulator (SOI) and silicon alloys can be used. Substrate 30 is preferably lightly doped. Shallow trench isolation (STI) regions may be formed to isolate devices.

In one embodiment, gate dielectric layer 32 includes silicon oxide, which may be formed by thermal oxidation of substrate 30. In other embodiments, gate dielectric layer 32 comprises dielectric materials having a high dielectric constant (k value), for example, greater than about 3.9. The preferred materials include silicon nitrides, oxynitrides, dielectric metal oxides such as $HfO_2$, $HfZrO_x$, $HfSiO_x$, $HfTiO_x$, $HfAlO_x$, and the like, combinations thereof, and multi-layers thereof. The preferred thickness ranges between about 6 Å and about 18 Å.

A first silicon-containing layer 34, which is formed on gate dielectric layer 32, may be a polysilicon layer or an amorphous silicon layer. The formation methods include commonly used chemical vapor deposition (CVD) methods such as low pressure CVD (LPCVD), plasma enhanced CVD (PECVD), and the like. The precursors preferably include a silicon-containing gas such as silane. In an exemplary embodiment, the process conditions include a silane flow of between about 50 sccm and about 1000 sccm, a temperature of between about 500° C. and about 650° C., and an ambient pressure of between about 0.1 torr and about 100 torr. In alternative embodiments, silicon-containing layer 34 contains silicon germanium, which may be formed by further introducing a germanium-containing gas, such as $GeH_4$, into the ambient in addition to the silicon-containing gas. Silicon-containing layer 34 is preferably un-doped. The thickness of silicon-containing layer 34 is preferably between about 30 Å and about 300 Å, and more preferably between about 50 Å and about 100 Å.

A second silicon-containing layer 38, which preferably comprises polysilicon or amorphous silicon, is then formed. Alternatively, silicon-containing layer 38 comprises SiGe. In one embodiment, silicon-containing layer 38 is in-situ doped with p-type impurities, such as boron and/or indium, with a preferred concentration of between about $1E20/cm^3$ and about $5E21/cm^3$. The formation process of silicon-containing layer 38 is similar to the formation of silicon-containing layer 34, except that the desired impurity is in-situ doped. In the preferred embodiment, the formation of silicon-containing layer 38 is in-situ performed with the formation of silicon-containing layer 34 without removing the wafer out of the ambient. This prevents a native oxide layer from been formed between silicon-containing layers 34 and 38. In an exemplary embodiment, the doping of impurities is achieved by simultaneously introducing silicon-containing precursors and impurity-containing process gases, such as $B_2H_6$. The thickness of silicon-containing layer 38 preferably ranges between about 300 Å and about 2500 Å.

Figure 4B:
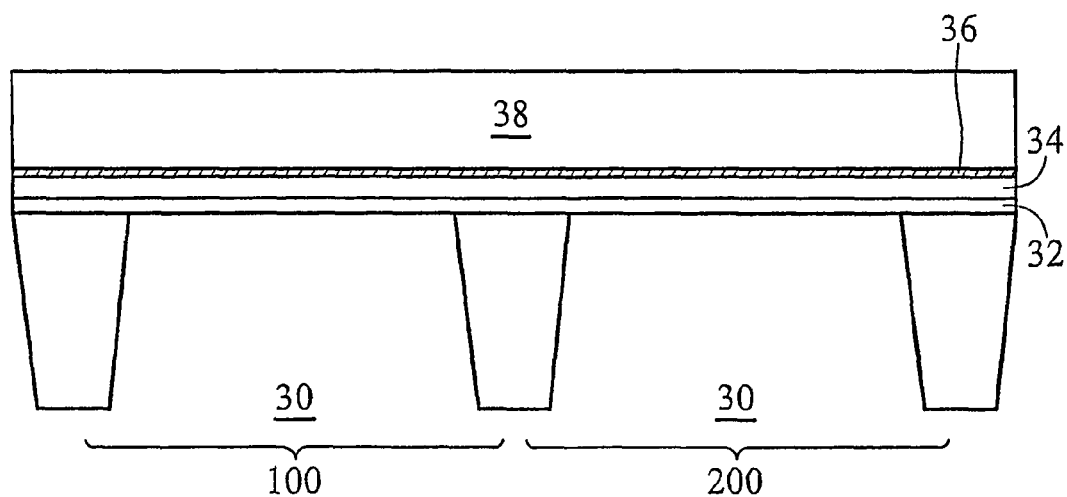

FIG. 4B illustrates an optional formation of a buffer layer such as an ultra thin nitride layer 36, which is preferably in-situ formed in the same ambient as forming silicon-containing layer 34, wherein the term in-situ indicates that substrate 30 is not moved out of the ambient between the steps for forming nitride layer 36 and silicon-containing layer 34. The thickness of nitride layer 36 is preferably less than about 15 Å, and more preferably between about 3 Å and about 5 Å. In an exemplary embodiment, thin nitride layer 36 is formed by nitridating a top surface of silicon-containing layer 34 using plasma or thermal nitridation. Since nitride layer 36 is very thin, even it is left in the resulting gates of MOS devices, the MOS devices' electrical behavior of the MOS devices are not affected.

Figure 5:
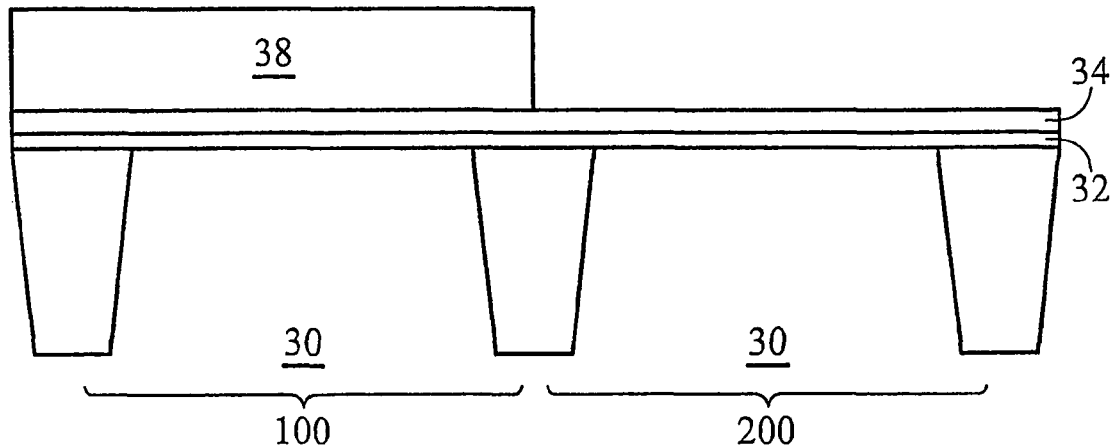

FIG. 5 illustrates the removal of silicon-containing layer 38 from NMOS region 200. In an exemplary embodiment, a photoresist (not shown) is formed to mask PMOS region 100. A dry etch is then performed by using, for example, HBr as an etchant. In the case nitride layer 36 exists (refer to FIG. 4B), the detection of nitrogen may be used as an indicator so that silicon-containing layer 34 is not etched. In alternative embodiments as shown in FIG. 4A, time mode is used to control the etching of silicon-containing layer 38 to avoid etching underlying silicon-containing layer 34. An advantageous feature of having silicon-containing layer 34 is that if an over-etching of silicon-containing layer 38 occurs, this will cause the removal of only a top portion of silicon-containing layer 34, instead of gate dielectric layer 32, thus eliminating the variations in thickness of gate dielectrics.

Figure 6:
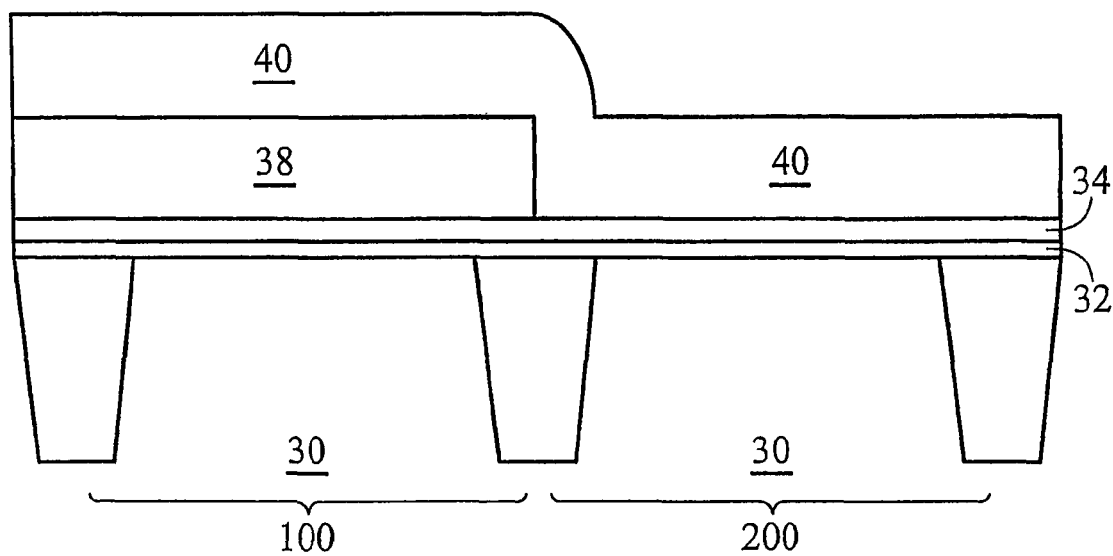

Referring to FIG. 6, a third silicon-containing layer 40 is blanket formed. Silicon-containing layer 40 preferably comprises polysilicon, amorphous silicon, or silicon germanium. The formation of silicon-containing layer 40 is similar to the formation of silicon-containing layer 38, except n-type impurities are in-situ doped. N-type impurities, such as phosphorous and/or arsenic, are preferably doped to a concentration of between about $5E20/cm^3$ and about $5E21/cm^3$. In an exemplary embodiment, the doping of the n-type impurities is achieved by simultaneously introducing silicon-containing precursors and impurity-containing process gases, such as $PH_3$ into the ambient. The thickness of silicon-containing layer 40 is preferably similar to that of silicon-containing layer 38.

Figure 7:
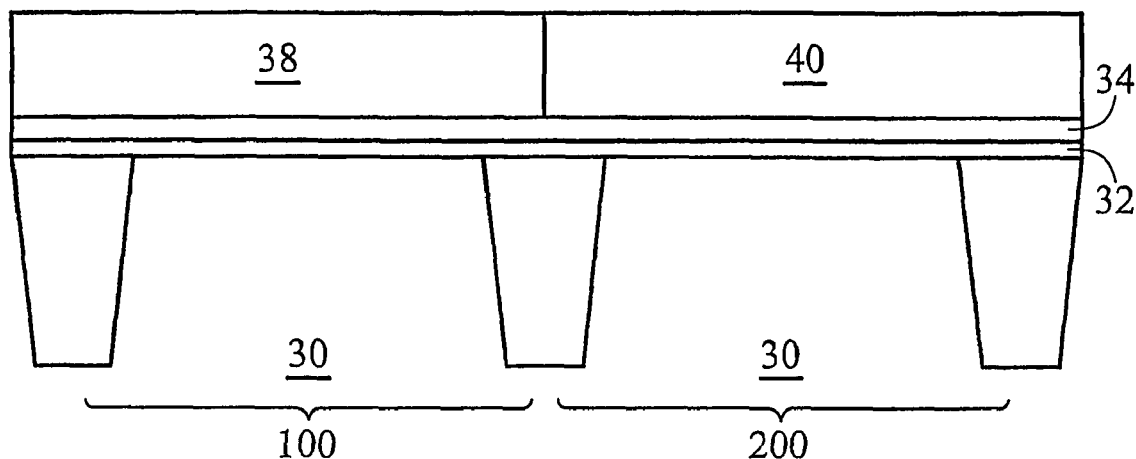

FIG. 7 illustrates the removal of silicon-containing layer 40 from PMOS region 100, which may be achieved by forming a photoresist (not shown) covering NMOS region 200, and etching portions of silicon-containing layer 40 in PMOS region 100.

In the embodiment discussed in the preceding paragraphs, p-type doped silicon-containing layer 38 is formed prior to the formation of n-type doped silicon-containing layer 40. In alternative embodiments, a n-type doped silicon-containing layer may be formed first. After a portion of the n-type doped silicon-containing layer is removed from PMOS region 100, a p-type doped silicon-containing layer is then formed in PMOS region 100.

Figure 8:
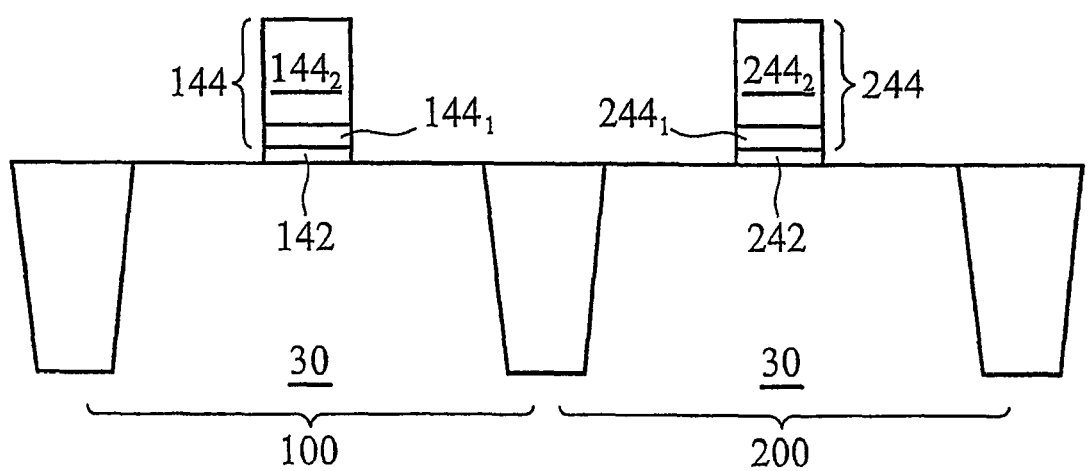

FIG. 8 illustrates the formation of gate stacks, wherein gate dielectric layer 32, doped silicon-containing layers 38 and 40, and un-doped silicon-containing layer 34 are patterned to form gate stacks in regions 100 and 200. As a result, the remaining portions of gate dielectric layer 32 and silicon-containing layers 34, 38 and 40 form gate dielectrics 142 and 242, and gate electrodes 144 and 244 in regions 100 and 200, respectively. Please note that gate electrode 144 includes un-doped portion $144_1$ and p-type doped portion $144_2$, and gate electrode 244 includes un-doped portion $244_1$ and n-type doped portion $244_2$.

Figure 9:
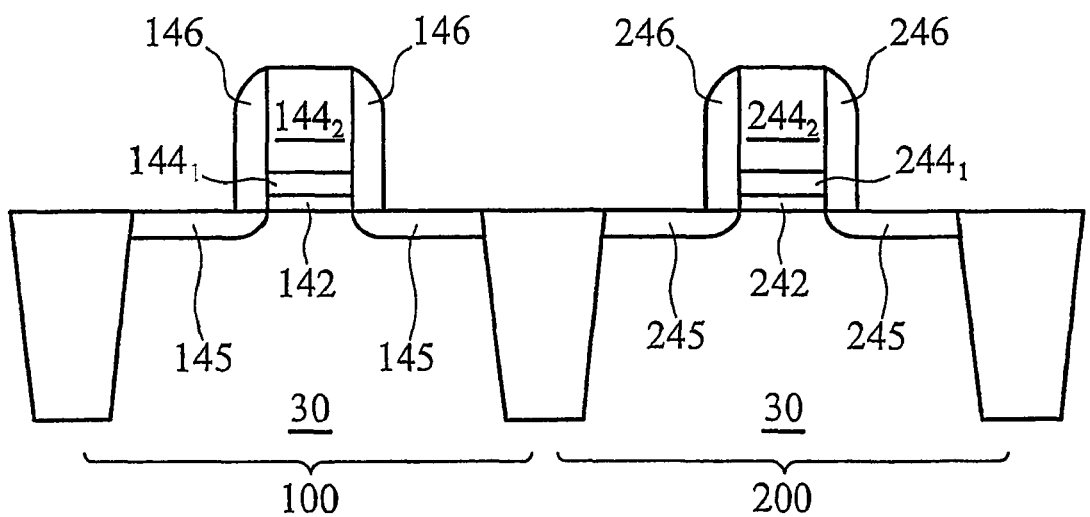

Lightly doped source/drain (LDD) regions 145 and 245 and gate spacers 146 and 246 are then formed, as is shown in FIG. 9. As is known in the art, LDD regions 145 and 245 may be formed by implanting p-type and n-type impurities into PMOS region 100 and NMOS region 200, respectively. Due to the masking of gate electrodes 144 and 244, LDD regions 145 and 245 are substantially aligned to the edges of gate electrodes 144 and 244, respectively. Gate spacers 146 and 246 may be formed by depositing one or more spacer layers (not shown), and removing horizontal portions of the spacer layers by etching. In the preferred embodiment, the spacer layers include a nitride layer on a liner oxide layer. The preferred spacer deposition methods include PECVD, LPCVD, sub-atmospheric CVD (SACVD), and the like.

Figure 10:
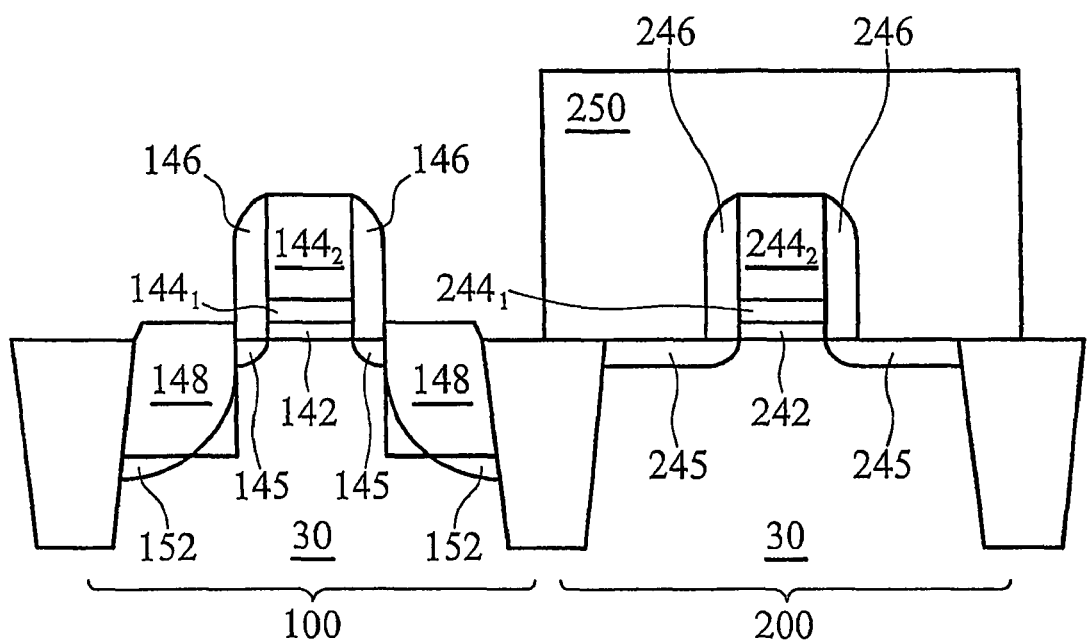

FIG. 10 illustrates the formation of silicon germanium (SiGe) stressors 148 and deep source and drain regions 152. Preferably, a hard mask layer 250 is formed to cover NMOS region 200. Recesses are formed in substrate 30 and aligned with the outer edges of gate spacers 146, preferably by etching isotropically or anisotropically. SiGe stressors 148 are then formed in the recesses. Hard mask layer 250 is then removed. In the preferred embodiment, SiGe stressors 148 are epitaxially grown. SiGe stressors 148 introduce a compressive stress in the respective channel region of the resulting PMOS device, and thus the drive current of the PMOS device is increased. In the preferred embodiment, SiGe stressors 148 are doped with a p-type impurity during the epitaxial growth, thus forming deep source/drain regions 152 of the respective PMOS devices. A further implantation can be performed to form deep source/drain regions 152. The resulting deep source/drain regions 152 are substantially aligned with edges of the spacers 146. Alternatively, no p-type impurity is doped when SiGe stressors 148 are epitaxially grown, and deep source/drain regions 148 are formed only by the implantation.

Figure 11:
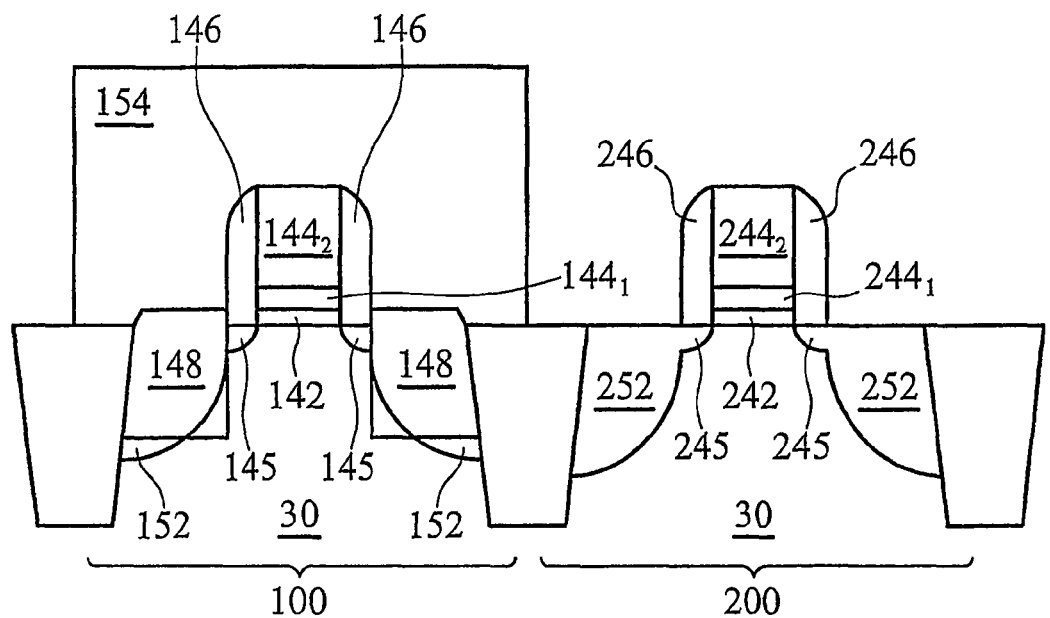

FIG. 11 illustrates the formation of deep source/drain regions 252, wherein n-type impurities, such as phosphorus and/or arsenic, are implanted. During the implantation, PMOS region 100 is masked by a photoresist 154, which is removed after the implantation.

An annealing (referred to as diffusion annealing hereinafter) is then performed to force impurities in gate electrode portions $144_2$ and $244_2$ to diffuse into the underlying portions $144_1$ and $244_1$, respectively. The diffusion annealing includes commonly used rapid thermal anneal (RTA) and solid phase epitaxy re-growth anneal, which are also used for annealing LDD regions 145 and 245 in order to form sharp junctions. In an exemplary embodiment, a RTA is performed at a temperature of between about 950° C. and about 1100° C. for less than about one minute. In another exemplary embodiment, a solid phase epitaxy re-growth anneal is performed at between about 500° C. and about 600° C. for about 1 minute to several hours. As a result of the diffusion annealing, gate electrode portions $144_1$ and $244_1$ also have impurities. Because the impurity concentrations in gate electrode portions $144_2$ and $244_2$ are high, and further because gate electrode portions $144_1$ and $244_1$ are relatively thin, the impurity concentrations in interface regions of gate electrodes 144 and 244 are high, and poly-depletion is substantially reduced, and possibly eliminated.

An additional annealing process (referred to as activation annealing hereinafter) is preformed to activate impurities in LDD regions 145 and 245 and deep source/drain regions 152 and 252. Preferably, annealing methods with very short durations are performed, which includes flash anneal, laser anneal, and the like. The order of the diffusion annealing and the activation annealing can be reversed.

Figure 12:
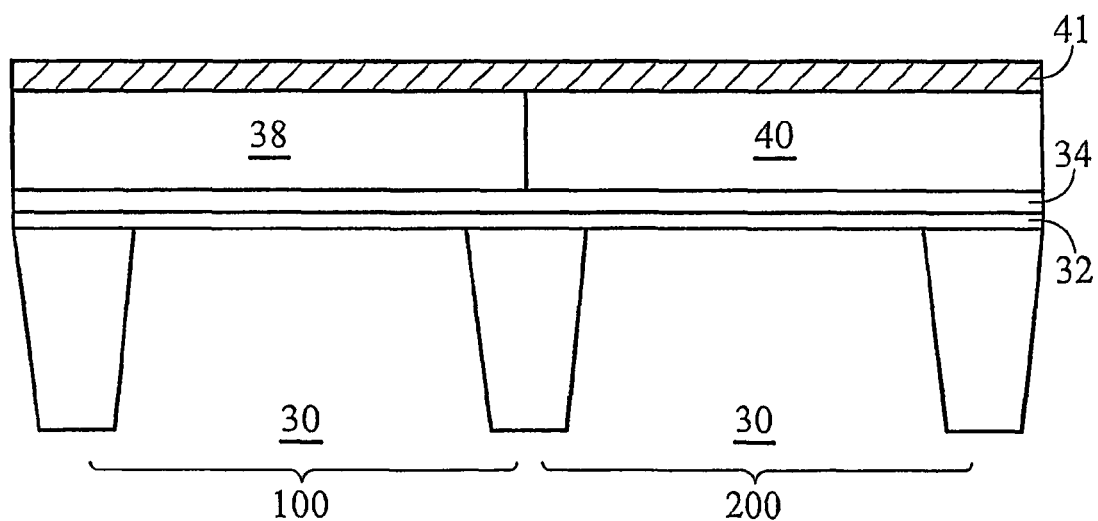

As discussed in preceding paragraphs, the diffusion annealing is preferably performed after the formation of LDD regions 145 and 245, so that only one annealing is needed to diffuse the impurities and at the same time anneal LDD regions. In other embodiments, diffusion annealing may be added any time after silicon-containing layers 38 and 40 are formed (refer to FIG. 7). FIG. 12 illustrates an embodiment in which the diffusion annealing is preformed after the formation of silicon-containing layers 38 and 40, but before their patterning. Preferably, capping layer 41, which may be formed of silicon nitride or silicon oxide, is formed on silicon-containing layers 38 and 40. The diffusion annealing is then performed. Capping layer 41 prevents the loss of the impurities from silicon-containing layers 38 and 40 into the annealing ambient. It also protects the annealing ambient from being polluted by the lost impurities. Capping layer 41 is removed after the diffusion annealing.

In other embodiments, the diffusion annealing is performed after the formation of gate stacks, but before the formation of LDD regions 145 and 245. In yet other embodiments, the diffusion annealing is performed after the formation of LDD regions 145 and 245, but before the formation of gate spacers 146 and 246.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
   providing a semiconductor substrate;
   forming a gate dielectric layer on the semiconductor substrate;
   forming a first silicon-containing layer on the gate dielectric layer, wherein the first silicon-containing layer is substantially free from p-type and n-type impurities;
   forming a second silicon-containing layer over the first silicon-containing layer, wherein the second silicon-containing layer comprises an impurity;
   etching the second silicon-containing layer in a region of the semiconductor substrate until the first-silicon containing layer is reached;
   forming a third silicon-containing layer over the first silicon-containing layer, second silicon-containing layer, and gate dielectric layer;
   removing the third silicon-containing layer formed over the second silicon-containing layer; and
   performing an annealing to diffuse the impurity in the second and third silicon-containing layers into the first silicon-containing layer.

2. The method of claim 1, wherein the method further comprises forming a capping layer on the second and third silicon-containing layers before performing the annealing.

3. The method of claim 1, wherein the annealing is performed after patterning the gate dielectric layer, the first silicon-containing layer, the second silicon-containing layer, and the third silicon-containing layer to form gate stacks.

4. The method of claim 1 further comprising forming an ultra thin nitride layer on the first silicon-containing layer.

5. The method of claim 3, wherein the annealing is performed after forming lightly-doped source and drain regions adjacent the gate stacks.

6. The method of claim 1, wherein the first silicon-containing layer comprises a material selected from the group consisting essentially of polysilicon, amorphous silicon and silicon germanium.

7. The method of claim 1, wherein the first silicon-containing layer has a thickness of between about 30 Å and about 300 Å.

8. The method of claim 1, wherein the second silicon-containing layer and the third silicon-containing layer have thicknesses of between about 300 Å and about 2500 Å.

9. The method of claim 1, wherein the annealing is selected from the group consisting essentially of rapid thermal annealing and solid phase epitaxy re-growth annealing.

10. The method of claim 1, wherein the steps of forming the first and the second silicon-containing layers are in-situ performed in a same ambient.

11. The method of claim 1, wherein the second silicon-containing layer and the third silicon-containing layer is in-situ doped to an impurity concentration of greater than about $1E20/cm^3$.

12. A method for forming a semiconductor structure, the method comprising:
    providing a semiconductor substrate having a first region and a second region;
    forming a gate dielectric layer on the semiconductor substrate in the first and second regions;
    thereafter, forming a first silicon-containing layer on the gate dielectric layer in the first and second regions of the semiconductor substrate, wherein the first silicon-containing layer is substantially free from p-type and n-type impurities;
    thereafter, forming a second silicon-containing layer over the first silicon-containing layer and the gate dielectric layer in the first region of the semiconductor substrate, wherein the second silicon-containing layer comprises a first impurity of a first conductivity type, and wherein the second region is free from the second silicon-containing layer;
    thereafter, forming a third silicon-containing layer over the first silicon-containing layer and the gate dielectric layer in the second region of the semiconductor substrate, wherein the third silicon-containing layer comprises a second impurity of a second conductivity type opposite the first conductivity type, and wherein the first region is free from the third silicon-containing layer; and
    performing a diffusion annealing to diffuse the first and the second impurities in the second and the third silicon-containing layers into the respective portions of the underlying first silicon-containing layer.

13. The method of claim 12, wherein the method further comprises forming a capping layer on the second silicon-containing layer before the step of annealing.

14. The method of claim 12, wherein the annealing is performed after patterning the gate dielectric layer and the first and the second silicon-containing layers.

15. The method of claim 12, wherein the step of forming the third silicon-containing layer comprises:
    forming the third silicon-containing layer in the first and the second regions, wherein a portion of the third silicon-containing layer in the first region is over the first silicon-containing layer; and
    removing the portion of the third silicon-containing layer in the first region.

16. The method of claim 12 further comprising forming a nitride layer on the first silicon-containing layer.

17. The method of claim 16, wherein the nitride layer has a thickness of less than about 15 Å.

18. The method of claim 12, wherein the diffusion annealing is performed after patterning of the first, the second and the third silicon-containing layers, and wherein the method further comprises:
    forming a capping layer before the step of annealing; and
    removing the capping layer after the step of annealing.

19. The method of claim 12, wherein the diffusion annealing is combined with an annealing for shaping lightly doped source and drain regions.

20. A method for forming a semiconductor structure, the method comprising:
    providing a semiconductor substrate comprising a first region and a second region;
    forming a gate dielectric layer on the semiconductor substrate in the first and second regions;
    thereafter, forming a first silicon-containing layer on the gate dielectric layer in the first and second regions, wherein the first silicon-containing layer is substantially free from p-type and n-type impurities;

thereafter, forming a second silicon-containing layer over the first silicon-containing layer and gate dielectric layer in the first and second regions, wherein the second silicon-containing layer is in-situ doped with a first impurity of a first conductivity type;

thereafter, removing the second silicon-containing layer from the second region;

thereafter, forming a third silicon-containing layer over the first silicon-containing layer and the gate dielectric layer in the second region, and over the first silicon-containing layer, second-silicon containing layer, and gate dielectric layer in the first region, and wherein the third silicon-containing layer is in-situ doped with a second impurity of a second conductivity type opposite the first conductivity type;

thereafter, removing the third silicon-containing layer from the first region;

patterning the gate dielectric layer, the first silicon-containing layer, and the second silicon-containing layer in the first region to form a first gate stack in the first region;

patterning the gate dielectric layer, the first silicon-containing layer, and the third silicon-containing layer in the second region to form a second gate stack in the second region; and performing an annealing to diffuse the first impurity into a portion of the first silicon-containing layer directly under a remaining portion of the second silicon-containing layer, and to diffuse the second impurity into a portion of the first silicon-containing layer directly under a remaining portion of the third silicon-containing layer.

* * * * *